US006991825B2

(12) United States Patent
Hui et al.

(10) Patent No.: US 6,991,825 B2
(45) Date of Patent: Jan. 31, 2006

(54) DISPENSATION OF CONTROLLED QUANTITIES OF MATERIAL ONTO A SUBSTRATE

(75) Inventors: Hon Chiu Hui, Kwai Chung (HK); Wing Fai Lam, Kwai Chung (HK); Ka Yee Mak, Kwai Chung (HK); Man Lai Manly Chau, Kwai Chung (HK)

(73) Assignee: ASM Assembly Automation Ltd., (HK)

( * ) Notice: Subject to any disclaimer, the term of this patent is extended or adjusted under 35 U.S.C. 154(b) by 256 days.

(21) Appl. No.: 10/144,164

(22) Filed: May 10, 2002

(65) Prior Publication Data

US 2003/0209560 A1    Nov. 13, 2003

(51) Int. Cl.
  *B05D 5/00*    (2006.01)
(52) U.S. Cl. .................... 427/98.4; 427/286; 118/712; 118/669; 118/410; 118/411; 118/313
(58) Field of Classification Search ............... 118/679, 118/712, 410, 669, 665, 697, 698, 704, 313–315, 118/411, 323; 427/8–10, 286, 284, 96.1, 427/98.4, 208.6, 207.1; 356/625–636; 222/55
See application file for complete search history.

(56) References Cited

U.S. PATENT DOCUMENTS

| 4,713,140 | A | * | 12/1987 | Tien |
| 5,110,615 | A | * | 5/1992 | Maiorca et al. |
| 5,666,325 | A | | 9/1997 | Belser et al. .................. 367/95 |
| 5,709,905 | A | * | 1/1998 | Shaw et al. |
| 5,711,989 | A | * | 1/1998 | Ciardella et al. ............... 427/8 |
| 5,837,892 | A | | 11/1998 | Cavallaro et al. ............. 73/149 |
| 5,906,682 | A | * | 5/1999 | Bouras et al. |
| 6,112,588 | A | | 9/2000 | Cavallaro et al. ............. 73/149 |
| 6,173,864 | B1 | * | 1/2001 | Reighard et al. .............. 222/55 |
| 6,204,469 | B1 | * | 3/2001 | Fields, Jr. et al. |
| 6,475,282 | B1 | * | 11/2002 | Snodgrass et al. |

* cited by examiner

*Primary Examiner*—Brenda A. Lamb
(74) *Attorney, Agent, or Firm*—Ostrolenk, Faber, Gerb & Soffen, LLP

(57) ABSTRACT

The invention provides an apparatus and method for dispensing material onto a substrate. The apparatus comprises a dispensing system having a dipenser and a control system adapted to adjust a quantity of material to be dispensed onto the substrate. It also includes an image capturing system adapted to acquire an image of the material that is dispensed onto the substrate, a measuring system to analyze the image and measure the quantity of material dispensed, and a compensation system adapted to provide a correction signal to the control system to vary the quantity of material dispensed.

33 Claims, 4 Drawing Sheets

1) Capture the image of 1st measuring point for pattern recognition

2) Move to the 2nd measuring point for pattern recognition and calculate the dimension of dispensed material according to encoder reading of gantry table in X-Y-Z movement.

DISPENSATION OF CONTROLLED QUANTITIES OF MATERIAL ONTO A SUBSTRATE

FIELD OF THE INVENTION

This invention relates to a method and apparatus for dispensing a quantity of material, such as an adhesive, onto a substrate, such as a printed circuit board. In particular, the quantity of material dispensed onto the substrate may be controlled so that the quantity of material dispensed does not vary beyond predetermined limits.

BACKGROUND AND PRIOR ART

There are a range of applications for which a measured quantity of material is to be dispensed onto a surface of a substrate. Often, in sensitive applications, the quantity of material dispensed needs to be closely monitored and controlled. One such application is in the field of semiconductors, wherein small amounts of adhesive are introduced onto a surface of a substrate, for the binding of certain electronic components onto the substrate. Another application in the field of semiconductors is encapsulation, which is a method used to protect the interconnections between electronic components and substrates. During encapsulation, material is dispensed onto certain electronic components that are located on the substrates, using processes such as dam-filling, to protect the components.

There are several methods and apparatus in the prior art as to how the volume, weight or physical dimensions of material dispensed can be measured during a calibration routine to ensure that quantities of materials dispensed are consistent. The quantity of dispensed material is periodically measured by various techniques, and feedback control systems are sometimes used to adjust the quantity of material dispensed in subsequent dispensing processes. Thus, these methods and apparatus seek to control the quantity of material dispensed with reference to predetermined levels.

One method of doing so is described in U.S. Pat. No. 5,666,325 for "Method and apparatus for monitoring and controlling the dispensing of materials onto a substrate". The dispensing system introduced in this invention controls the flow of material onto a substrate by monitoring the dimensions of dispensed material, which are generally in the form of a triangular bead. A sensor for transmitting and receiving ultrasonic waves or focused shock waves is used to measure the flow of material with reference to predetermined dimensions of the triangular bead of material (that is, height, base and/or cross-sectional area). This method of measuring the dimensions of a bead using sensors has certain shortcomings. The ultrasonic or shock wave sensor may not be sufficiently sensitive to be able to measure smaller objects because the accuracy of the device will be reduced the smaller the dimension of the object. Moreover, the unidirectional transmission of sound or shock waves is more applicable to beads having triangular shapes, whereas the actual shape of dispensed material might be in hump shapes, in which event the measurement of both width and height will tend to be unreliable.

Another prior art method of controlling the dispensation of materials is described in U.S. Pat. Nos. 5,837,892 and 6,112,588 for a "Method and apparatus for measuring the size of drops of a viscous material dispensed from a dispensing system". This invention measures the size of drops of viscous material dispensed from a dispensing system. A special station is devised for doing so. At the station, a dispenser first dispenses a quantity of the viscous material onto a bottom plate of a measuring apparatus. A top plate is then placed over the bottom plate and compresses the dispensed material between these two plates at a predetermined distance between the top plate and bottom plates. A viewing system then views the compressed viscous material to determine the quantity of viscous material dispensed. A controller may thus control the quantity of viscous material dispensed based on the quantity of material measured by the viewing system.

A disadvantage of this system is that real-time and on-line measurement of the material as it is being dispensed is not possible because of the need for a separate station. Furthermore, the measuring system is inflexible because of the need for the material to be dispensed within a confined area as indicated by opaque lines found on the top and bottom plates of the measuring apparatus. Another limitation is that only dot forms of dispensed material can be measured using this method and disposal procedures for the target drops are required.

SUMMARY OF THE INVENTION

It is therefore an object of this invention to provide an improved method and apparatus for dispensing measured quantities of material onto a substrate and to control the dispensing thereof within predetermined limits.

Thus, the invention is capable of measuring the dimensions of beads of material being dispensed onto a substrate as such material is dispensed, and processes such information received, thereby controlling and compensating for the dispensing of material in the next dispensing process.

According to one aspect of the invention there is provided an apparatus for dispensing material onto a substrate comprising:
  a dispensing system having a dispenser;
  a control system adapted to adjust a quantity of material to be dispensed onto the substrate;
  an image capturing system adapted to acquire an image of the material that is dispensed onto the substrate and a measuring system to analyze the image and measure the quantity of material dispensed; and
  a compensation system adapted to provide a correction signal to the control system to vary the quantity of material dispensed.

According to a second aspect of the invention there is provided a method for dispensing material onto a substrate comprising the steps of:
  dispensing a quantity of material onto the substrate by way of a dispenser and adjusting a quantity of material to be dispensed using a control system;
  acquiring an image of the material that is dispensed onto the substrate;
  analyzing the image to measure the quantity of material dispensed; and providing a correction signal to the control system to vary the quantity of material dispensed.

Using the invention it is possible to provide an apparatus and a method which are able to measure the dimensions of a quantity of material being dispensed onto a substrate, and to use such measurement to control and compensate for the dispensing of subsequent material in the next dispensing process.

It will be convenient hereinafter to describe the invention in greater detail by reference to the accompanying drawings which illustrate one embodiment of the invention. The particularity of the drawings and the related description is not to be understood as superseeding the generality of the broad identification of the invention as defined by the claims.

BRIEF DESCRIPTION OF THE DRAWINGS

The drawings relate to a preferred embodiment of the invention, in which.

DETAILED DESCRIPTION OF THE PREFERRED EMBODIMENT OF THE INVENTION

Figure 1:
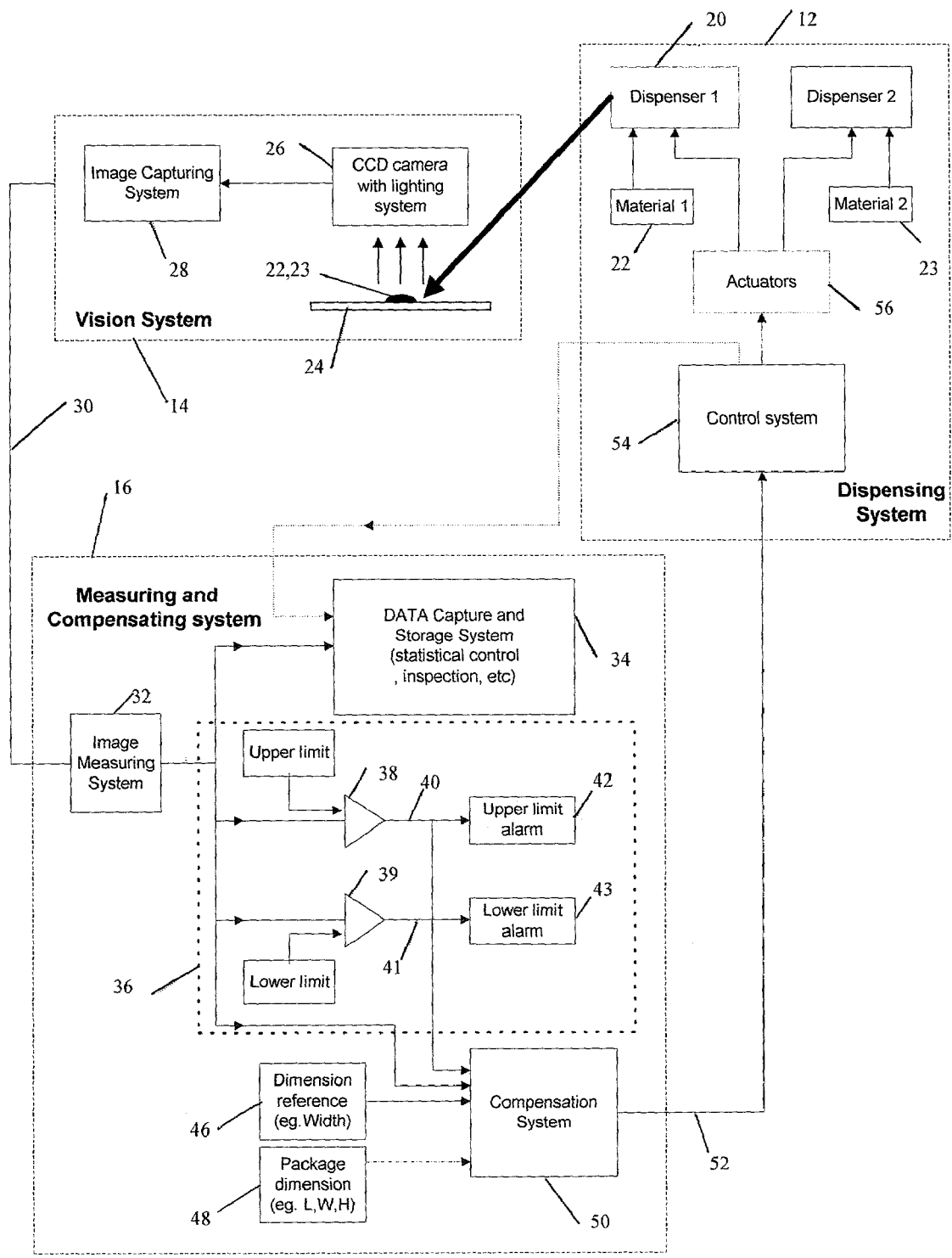
FIG. 1 is a schematic diagram showing the interrelationships between a dispensing system, vision system incorporating an image capturing system, and measuring and compensating system in a preferred embodiment of the invention.

FIG. 1 is a schematic diagram showing the interrelationships between a dispensing system 12, vision system 14 incorporating an image capturing system 28, and measuring and compensating system 16 of an apparatus 10 according to a preferred embodiment of the invention. The dispensing system 12 comprises dispensers 20,21 which are adapted to dispense material 22,23, actuators 56 to actuate various mechanisms affecting rate of flow of material 22,23 from the dispensers 20,21 and a computer control system 54 which responds to feedback on the volume of material 22,23 dispensed by the dispensers and to change the quantity of material 22,23 that is released by the dispensers 20,21, if necessary. Although there are two dispensers 20,21 illustrated in the preferred embodiment, the invention will function equally well with one or more dispensers, with suitable modifications. The desirability of using more than one dispenser is that more than one material may be dispensed almost simultaneously if different materials are stored in separate dispensers. For convenience, the following description will be limited where applicable to the description of only one dispenser; namely first dispenser 20 holding a first type of material 22.

The dispenser 20 dispenses a quantity of material 22 onto a substrate 24. A CCD camera 26 is located over the dispensed material 22 to record an image of the material 22. The image of the material 22 is acquired and recorded by an image capturing system 28 to be transmitted to the measuring and compensating system 16 through an electronic link 30. This technique of measuring the material 22 allows the multi-point analysis of an image of the dispensed material 22 captured by the CCD camera 26.

The measuring and compensating system 16 generally comprises an image measuring system 32, data capture and storage system 34, alarm system 36 and compensation system 50. The length and width of the material 22 are measured by the image measuring system 32 essentially by measuring the number of pixels in the image that define respectively the length and width of the material 22. The height of the material 22 is measured using a laser displacement sensor, as will be described below with reference to FIG. 5. The average dimensions of dispensed material 22 is determined according to an algorithm of the image measuring system 32.

After measurement of the material's dimensions, the information is transmitted to a data capture and storage system 34 where storage means stores the information for statistical control, inspection and further analysis, and other purposes. Also, the data is sent to an alarm system 36, which activates an alarm if the dimensions of the material 22 exceeds an upper limit or falls below a lower limit. The alarm system 36 comprises an upper limit detector 38 that produces an upper limit signal 40 if the upper limit is exceeded, and a lower limit detector 39 that produces a lower limit signal 41 if the dimensions fall below the lower limit. Accordingly, an upper limit alarm 42 or a lower limit alarm 43 is activated. The alarm may be activated in the form of an electronic signal. All alarm signals 40,41 may also be stored in the data capture and storage system for future reference.

The data regarding the dimensions of the material 22 is also compared to a dimension reference (providing a particular reference dimension of material, such as width) and/or a package dimension reference (providing all reference dimensions of a package, such as the length, width and height). The information resulting from comparison with the respective dimension references 46,48 as well as the alarm signal 42,43, if any, is transmitted to a compensation system 50. The compensation system 50 decides, with regard to such information, whether changes to the output of the dispenser 20 is necessary. If changes are necessary, a relevant correction signal 52 is sent to the computer control system 54. The computer control system 54 controls the actuators 56 to produce a desired output.

Figure 2:
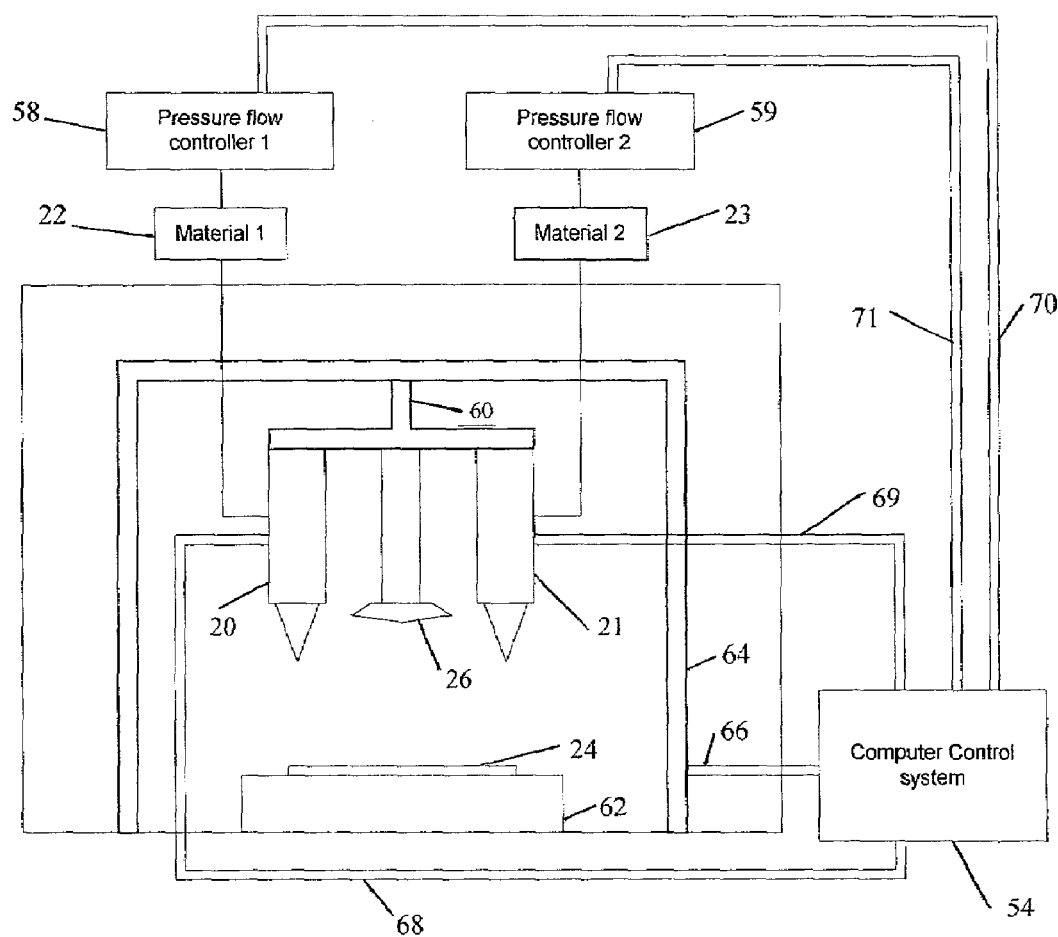
FIG. 2 is a schematic diagram illustrating some functional components of the dispensing system of the preferred embodiment.

FIG. 2 is a schematic diagram illustrating some functional components of the dispensing system 12 of the preferred embodiment. The dispensing system includes two dispensers 20,21 to which are fed separate materials 22,23. Feeding of materials 22,23 to the dispensers 20,21 is controlled by pressure flow controllers 58,59. A computer control system 54 is adapted to send appropriate signals to the actuators 56 to actuate mechanisms such as the pressure flow controller 58,59 to control the flow of materials 22,23 from the dispensers 20,21.

During the operation of the dispensers 20,21, the substrate 24 may be placed on a workholder 62 manually, or may be loaded into the apparatus 10 by a conveyor system (not shown). In order to secure the substrate 24 to the workholder 62, vacuum suction may be used. A CCD camera 26 is used as a means to acquire an image of the substrate 24 for the image capturing system 28, for providing alignments of the dispensers 20,21 with respect to the substrate 24 so that the dispensers 20,21 can properly dispense material 22,23 onto predetermined locations on the substrate 24. Apart from this, as discussed above, the CCD camera 26 is connected to the image capturing system 28 and the measuring and compensating system 16 in order to inspect the dimensions of dispensed material 22,23 such as width, length, etc during the calibration routine or to conduct direct online compensation to ensure that correct amounts of material 22,23 are dispensed and located on the substrates 24.

In the dispensing process, a dispenser 20,21 dispenses materials through a nozzle onto the substrate 24. Meanwhile, the computer control system 54, which is pre-programmed with a desired dispensing pattern, controls actuators 56 including pressure flow, pump and gantry table, in the X, Y and Z directions so that the dispensers 20,21 can dispense materials 22,23 in different patterns over different types of substrates 24.

After a dispenser 20,21 dispenses material 22,23 onto the substrate 24 placed on the workholder 62, the CCD camera 26 records an image of the material 22,23 in an environment where lighting has been suitably adjusted for sufficient contrast and brightness. As previously discussed, the image of the material 22,23 is processed and its dimensions are determined. A correction signal 52 is sent to the computer control system 54 if a change to the material output is necessary.

The dispensers 20,21 are coupled via a dispensing head 60 to a positioning means, such as a gantry table 64. The gantry table 64 is movable in the X, Y and Z directions in order to locate each of the dispensers 20,21 over the substrate 24. The movement of the gantry table 64 may be controlled by the computer control system 54 through gantry table control signals 66. Under the control of the computer control system 54, the dispensers 20,21 and CCD camera 26 may be located at predetermined locations and heights in the X, Y and Z directions over the substrate 24. Furthermore, the computer control system 54 sends pump speed control signals 68,69 to the dispensers 20,21 which signals control the pump speeds. The computer control system 54 also sends pressure flow control signals 70,71 to the pressure flow controllers 58,59 to control the pressure flow of materials 22,23.

Through the pump speed control signals 68,69, gantry table control signals 66 and pressure flow control signals 70,71, the computer control system 54 can simultaneously control actuators such as the pressure flow controllers 58,59, pump speeds of the dispensers 20,21, and the table speed of the gantry table 64. Therefore, in general, the dimensions of the dispensed materials 22,23 can be increased with pump speed and pressure flow, but are decreased with increased gantry table speed.

Figure 3:
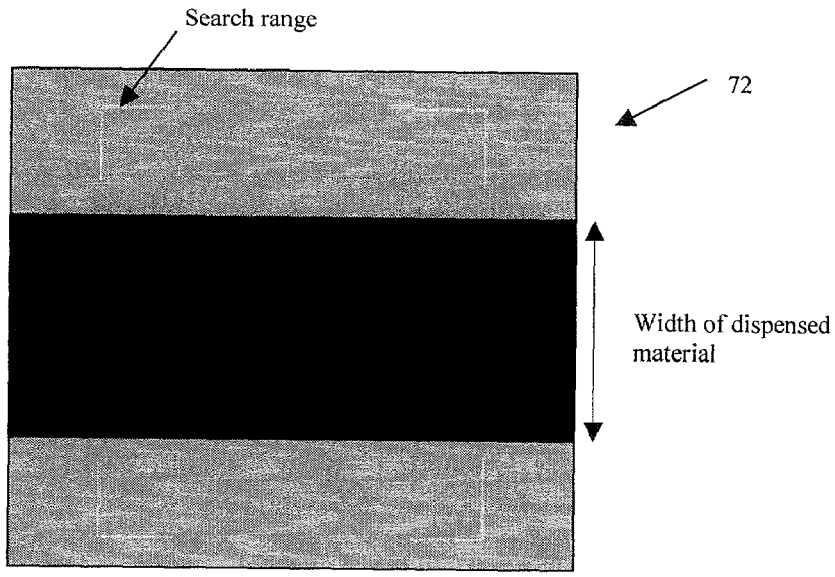
FIG. 3 shows an image of dispensed material used to measure a width of the material, when the material is within the search range of the image capturing system.

FIG. 3 shows an image 72 of dispensed material 22,23 used to measure a width of the material 22,23, when the material is within the search range of the image capturing system 28. The width of the material 22,23 can be measured simply with reference to the number of pixels found within the dark band.

Figure 4:
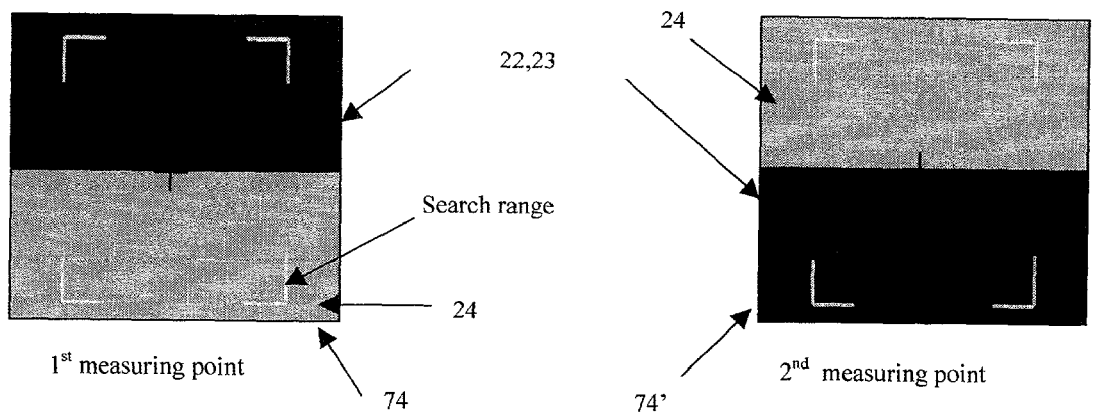
FIG. 4 shows images of dispensed material used to measure a width of the material, when the material is outside the search range of the image capturing system.

FIG. 4 shows images 74,74' of dispensed material 22,23 used to measure a width of the material 22,23, when the material is outside the search range of the image capturing system 28. An image 74 is first captured at a first measuring point corresponding to an edge of the material 22,23 represented by a dark band. The gantry table 64 then moves the CCD camera 26 to a second measuring point corresponding to an opposite edge of the material 22,23. The gantry table 64 is fixed with an encoder (not shown) to determine its position in the X, Y and Z directions. Thus, the width of the material 22,23 is represented by the difference in the encoder readings between the positions at the opposite edges of the dark band.

Figure 5:
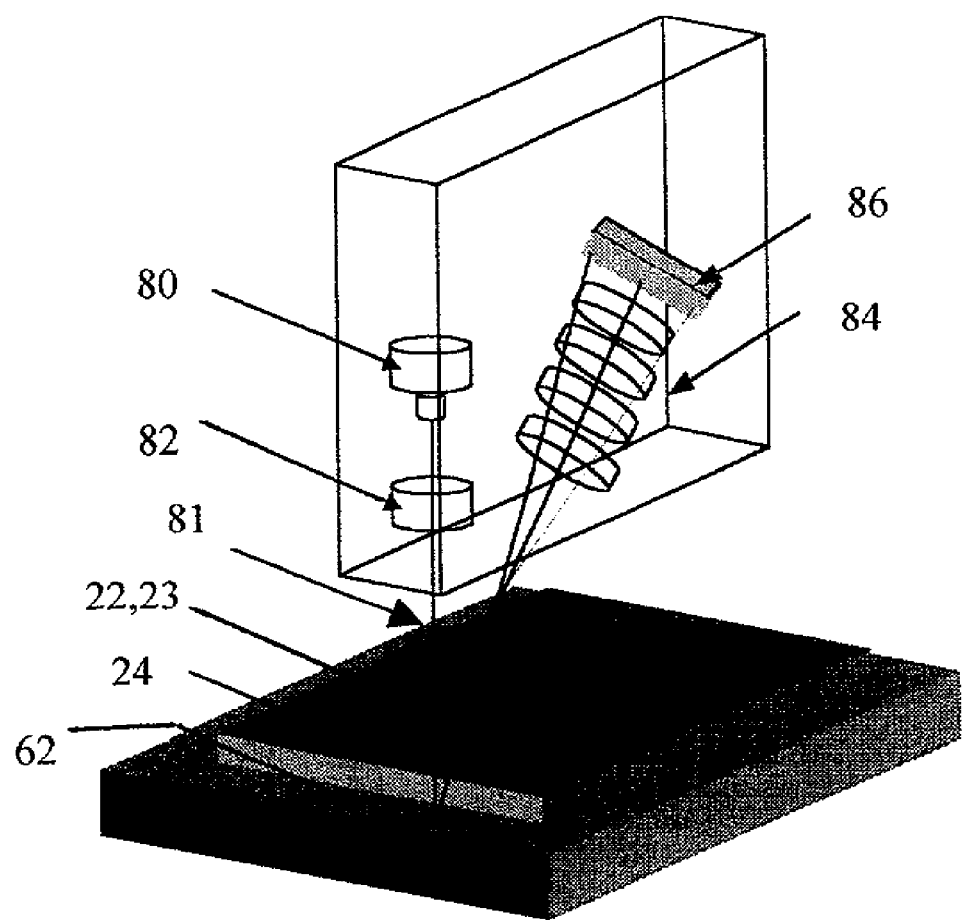
FIG. 5 is an isometric view of components of apparatus according to the invention used to measure the height of dispensed material using a laser displacement sensor.

FIG. 5 is an isometric view of components of apparatus according to the invention used to measure the height of dispensed material 22,23 using laser displacement sensor comprising a laser beam 81. The substrate 24 is placed on, and secured to, a workholder 62. Material 22, 23 is dispensed onto the substrate 24. A laser diode 80 generates a laser beam 81 that is projected by a transmitter lens 82 onto the dispensed material 22,23. A receiver lens 84 receives laser beams 81 reflected from positions representing the top of the dispensed material 22,23, the top of the substrate 24 and the top of the workholder 62. The relative positions of the laser beams 81 are captured by a laser displacement sensor CCD camera 86 and measured. Any other suitable device can be used in place of the second CCD camera 86 to detect the positions of the laser beam 81. The height of the material 22,23 is determined by the difference between the top of the substrate 24 and the top of the material 22,23.

One way in which the separate dispensers 20,21 may be operated in use is that one dispenser 20 may be used to dispense dam material to create a dam on the substrate and the other dispenser 21 may be used to dispense fill material within the confines of the dam. In such use, only a correction signal for the dam dispenser 20 is necessary, as once the width of the dam is controlled through measurement of material and compensation, the fill volume is fixed and need not be controlled, although correction signals in relation to both dispensers 20,21 could also be implemented.

In a particularly preferred embodiment of the invention, the procedure undertaken in a dam-fill process is that the dam dispenser 20 first dispenses dam material 22 in a ring or square form. The fill dispenser 21 then dispenses fill material 23 within the dam ring/square. If the width of the dam material 22 is changed, the volume required for the fill material 23 is also changed. The width of the dispensed dam material 22 is constantly measured using the components and technique described above. If a variation in the width of the dam occurs, correction signals for the fill dispenser 21 are then calculated using a compensating system so that the volume of dispensed fill material 23 can be corrected. Meanwhile, correction signals for the dam dispenser 20 are also calculated so that the dam dispenser 20 can dispense a corrected dam width in the next process, if necessary.

It will be appreciated that the embodiments of the invention described hereinbefore with reference to the drawings provide a controlled dispensing process resulting in greater efficiency due to faster measurement in real time as material is being dispensed onto a substrate. There is also greater flexibility when using the invention as there can be multipoint analysis of a single captured image of the dispensed material, such multipoint analysis means that more parameters concerning the material can be taken into account by the measurement and control system. Thus, flexibility is provided to online calibration and compensation, and online statistical process control is also enabled. Furthermore, there is no need for contact with the material to measure the quantity of material, which might then require other mechanisms to regulate and control that contact and subsequently to remove material from the contact surface.

The invention described herein is susceptible to variations, modifications and/or additions other than those specifically described and it is to be understood that the invention includes all such variations, modifications and/or additions which fall within the spirit and scope of the above description.

What is claim is:

1. An apparatus for dispensing material onto a substrate comprising:
   a dispensing system having a dispenser which is operative to dispense a strip of material having a controllable width;
   a control system operative in real time to adjust the width of the strip of material being dispensed on the substrate by the dispenser;
   an image capturing system operative to acquire image data indicating the width of the strip of material being dispensed onto the substrate; and a measuring system operative to analyze the image data to determine the width of the strip of material being dispensed, and to compare the determined width with a desired width to generate a correction signal;

wherein the control system is responsive to the correction signal in real time to vary the quantity of material being dispensed.

2. An apparatus according to claim 1, further includes an alarm system that activates an alarm when the measuring system indicates that the width of the strip of material being dispensed exceeds a predetermined upper limit or falls below a predetermined lower limit.

3. An apparatus according to claim 1, wherein the control system is coupled to an actuator for one or more mechanisms which control the quantity of material being dispensed by the dispenser.

4. An apparatus according to claim 3, wherein the actuator is operable to change one or more of a pump speed of the dispenser and a flow pressure of the dispenser and the speed of movement of the dispenser to change the width of the strip of material dispensed.

5. An apparatus according to claim 1, wherein the dispensing system is coupled to a positioning mechanism operable to move the dispenser in the X, Y and Z directions while the dispenser is dispensing a strip of material.

6. An apparatus according to claim 5, wherein the image capturing system is adapted to capture an image for the purpose of alignment of the positioning mechanism to ensure that the material is dispensed at predetermined locations on the substrate.

7. An apparatus according to claim 5, wherein the positioning mechanism is operatively connected to an encoder which is operative to indicate a position of the dispenser relative to the substrate.

8. An apparatus according to claim 1, wherein the image capturing system is adapted to acquire an image of one edge of an area of dispensed material and another image of an opposite edge of the area of dispensed material, whereby the distance between the opposite edges represents the width of the strip of dispensed material.

9. An apparatus according to claim 1, further comprising a laser displacement sensor adapted to locate positions of a laser beam reflected off surfaces to be measured, for measuring the height of a quantity of material dispensed on the substrate.

10. An apparatus according to claim 9, wherein the height of the material is measured by the distance between paints corresponding to the top of the material and the top of the substrate.

11. An apparatus according to claim 1, including a data storage system adapted to store data on measurements of materials dispensed and data on correction signals generated.

12. An apparatus according to claim 1, wherein the image capturing system is positioned above the substrate and is operative to acquire image data showing a plan view of the material dispensed relative to the substrate.

13. An apparatus according to claim 1, wherein the image capturing system is operative to acquire image data representing opposite edges of an area of dispensed material, and the measuring system is operative to determine the distance between the opposite edges as a measure of the width of the dispensed material.

14. An apparatus according to claim 1, wherein the dispensing system further comprises and second dispenser the dispenser operative to dispense a strip of material having a controllable width and the second dispenser are each operative to dispense a different material or operative to dispense material in a different manner.

15. An apparatus for dispensing material onto a substrate comprising:

a dispensing system having first and second dispensers;

a control system operative to adjust a quantity of material to be dispensed on the substrate by the dispensers;

an image capturing system operative to acquire image data indicating a width of the material that is dispensed onto the substrate;

a measuring system operative to analyze the image data and measure the width of material dispensed; and a compensation system responsive to the measuring system to provide a correction signal to the control system to vary the quantity of material dispensed, wherein the first and second dispensers are each operative to dispense a different material or operative to dispense material in a different manner.

16. An apparatus according to claim 15, wherein the first dispenser dispenses dam material and the second dispenser dispenses fill material.

17. An apparatus according to claim 16, wherein the compensation system does not provide a correction signal with respect to the second dispenser.

18. A method for dispensing material onto a substrate comprising the steps of:

dispensing a strip of material onto the substrate using a first dispenser;

controlling the width of the ship of material being dispensed using a control system;

acquiring image data indicating the width of the strip of material being dispensed onto the substrate;

analyzing the image to determine the width of the strip being dispensed;

comparing the determined width with a desired width to generate a correction signal; and providing the correction signal to the control system in real time to control the width of the strip of material being dispensed.

19. A method according to claim 18, further comprising the step of activating an alarm when the width of the strip of material being dispensed exceeds a predetermined upper limit or falls below a predetermined lower limit.

20. A method according to claim 18, further comprising changing a pump speed and/or a flow pressure of a dispenser to change the width of the strip of material being dispensed.

21. A method according to claim 18, wherein the material is dispensed while moving the dispenser in the X, Y and Z directions.

22. A method according to claim 12, wherein the width of the strip of material being dispensed is varied by varying the speed of movement of the dispenser.

23. A method according to claim 18, further including the steps of:

acquiring an image of the substrate; and utilizing the image of the substrate to align the dispenser to ensure that the material is dispensed at predetermined locations on the substrate.

24. A method according to claim 18, including the step of acquiring an image of one edge of an area of dispensed material and another image of an opposite edge of the area of dispensed material, whereby the distance between the opposite edges represent the width of the dispensed material.

25. A method according to claim 18, including the steps of:

reflecting a laser beam off surfaces on a substrate having material dispensed thereon; and processing the reflected laser beam to determine the height of a quantity of material dispensed on the substrate.

26. A method according to claim 25, wherein the height of the material is determined from the distance between points corresponding to the top of the material dispensed and the top of the substrate.

27. A method according to claim 18, which includes the step of using a second dispenser to dispense a material different from material dispensed by the first dispenser, or to dispense material in a different manner from that of the first dispenser.

28. A method according to claim 27, wherein the first dispenser dispenses dam material and the second dispenser dispenses fill material.

29. A method according to claim 28, wherein a correction signal is not provided with respect to the dam material.

30. A method according to claim 28, including the step of measuring the width of the dam material and generating a correction signal in response thereto to regulate the quantity of fill material dispensed by the second dispenser.

31. A method according to claim 18, including the step of storing data on measurements of materials dispensed and data on correction signals generated in a data storage system.

32. A method according to claim 18, wherein the acquired image data show the material dispensed relative to the substrate in plan view.

33. A method according to claim 18, wherein the acquired image data represent opposite edges of an area of dispensed material, and the image data is analyzed to determine distance between the opposite edges as a measure of the width of the dispensed material.

* * * * *